(12) United States Patent
Zhang et al.

(10) Patent No.: US 9,112,532 B1
(45) Date of Patent: *Aug. 18, 2015

(54) QC-LDPC DECODER WITH LIST-SYNDROME DECODING

(71) Applicant: Marvell International Ltd., Hamilton (BM)

(72) Inventors: Yifei Zhang, Milpitas, CA (US); Hongwei Song, Longmont, CO (US); Gregory Burd, San Jose, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 354 days.

This patent is subject to a terminal disclaimer.

(21) Appl. No.: 13/661,541

(22) Filed: Oct. 26, 2012

Related U.S. Application Data

(63) Continuation of application No. 13/397,479, filed on Feb. 15, 2012, now Pat. No. 8,301,984, which is a continuation of application No. 12/180,229, filed on Jul. 25, 2008, now Pat. No. 8,127,209.

(60) Provisional application No. 60/952,747, filed on Jul. 30, 2007.

(51) Int. Cl.
  *H03M 13/00* (2006.01)
  *H03M 13/11* (2006.01)
  *H03M 13/03* (2006.01)

(52) U.S. Cl.
  CPC ........ *H03M 13/1142* (2013.01); *H03M 13/036* (2013.01)

(58) Field of Classification Search
  CPC .................. H03M 13/1142; H03M 13/116
  USPC .................................................. 714/780, 785
  See application file for complete search history.

(56) References Cited

U.S. PATENT DOCUMENTS 3,909,721 A * 9/1975 Bussgang et al. .............. 375/280
4,291,406 A * 9/1981 Bahl et al. ...................... 714/787

(Continued)

FOREIGN PATENT DOCUMENTS

EP  1 271 835  1/2003
EP  1 501 210  1/2005

(Continued)

OTHER PUBLICATIONS 802.16e: IEEE Standard for Local and metropolitan area networks Part 16: Air Interface for Fixed and Mobile Broadband Wireless Access Systems Amendment for Physical and Medium Access Control Layers for Combined Fixed and Mobile Operation in Licensed Bands (Feb. 2006).

(Continued)

*Primary Examiner* — Joseph D Torres

(57) ABSTRACT

A QC-LDPC decoding system employing a trapping set look-up table is provided. The QC-LDPC decoding system includes an iterative decoder that utilizes a message-passing algorithm to decode a received codeword. If the iterative decoder fails to produce a valid codeword, additional processing is performed to decode the received codeword. The additional processing includes the steps of computing the syndrome pattern of the received codeword, searching the look-up table for a trapping set class that is responsible for the iterative decoder's failure, retrieving from the look-up table a syndrome pattern and an error pattern of a member of the responsible trapping set class, and calculating the error pattern of the received codeword based on its syndrome pattern and the information retrieved from the look-up table. The received codeword is then corrected based on its error pattern.

20 Claims, 15 Drawing Sheets

(56) References Cited

U.S. PATENT DOCUMENTS

| | | | |
|---|---|---|---|
| 4,397,022 A * | 8/1983 | Weng et al. | 714/783 |
| 4,782,490 A * | 11/1988 | Tenengolts | 714/756 |
| 4,849,975 A * | 7/1989 | Patel | 714/761 |
| 5,179,560 A * | 1/1993 | Yamagishi et al. | 714/761 |
| 5,280,488 A * | 1/1994 | Glover et al. | 714/784 |
| 5,420,873 A * | 5/1995 | Yamagishi et al. | 714/761 |
| 5,659,557 A * | 8/1997 | Glover et al. | 714/752 |
| 5,680,340 A * | 10/1997 | Glover et al. | 708/492 |
| 5,875,200 A * | 2/1999 | Glover et al. | 714/784 |
| 5,982,294 A * | 11/1999 | Takayama et al. | 340/7.44 |
| 6,640,327 B1 | 10/2003 | Hallberg | 714/785 |
| 7,949,931 B2 * | 5/2011 | Lastras-Montano | 714/785 |
| 8,127,209 B1 * | 2/2012 | Zhang et al. | 714/780 |
| 8,321,746 B2 | 11/2012 | Li et al. | |
| 2006/0107167 A1 | 5/2006 | Jeong et al. | |
| 2008/0025427 A1 | 1/2008 | Lee et al. | |
| 2008/0025429 A1 | 1/2008 | Lee et al. | |
| 2008/0025443 A1 | 1/2008 | Lee et al. | |
| 2008/0037670 A1 | 2/2008 | Lee et al. | |
| 2008/0063103 A1 | 3/2008 | Lee et al. | |
| 2008/0198941 A1 | 8/2008 | Song et al. | |
| 2009/0106625 A1 | 4/2009 | Jun et al. | |
| 2010/0042904 A1 | 2/2010 | Gunnam | |
| 2011/0041033 A1 | 2/2011 | Yedidia et al. | |
| 2011/0083058 A1 | 4/2011 | Hu et al. | |
| 2011/0126075 A1 | 5/2011 | Gunnam | |
| 2011/0138253 A1 | 6/2011 | Gunnam | |
| 2012/0005552 A1 | 1/2012 | Gunnam | |
| 2012/0089888 A1 | 4/2012 | Li et al. | |

FOREIGN PATENT DOCUMENTS

| | | |
|---|---|---|
| WO | WO 00/52873 | 9/2000 |
| WO | WO 02/067491 | 8/2002 |

OTHER PUBLICATIONS

Acolatse, Kodzovi et al., "An Alamouti-based Hybrid-ARQ Scheme for MIMO Systems," 14th IST Mobile and Wireless Communications, Dresden (Jun. 2005).

Acolatse, Kodzovi et al., "Space Time Block Coding HARQ Scheme for Highly Frequency Selective Channels," 2007 IEEE International Conference on Communications, pp. 4416-4420 (Jun. 24, 2007).

Alamouti, Siavash M., "A Simple Transmit Diversity Technique for Wireless Communications," IEEE Journal on Select Areas in Communications, vol. 16, No. 8 (Oct. 1998).

Cavus, Enver et al., "A Performance Improvement and Error Floor Avoidance Technique for Belief Propagation Decoding of LDPC Codes," 2005 IEEE 16th International Symposium on Personal, Indoor and Mobile Radio Communications, 978-3-8007-2909-8/05, pp. 2386-2390 (Aug. 2005).

Chase, David, "Code Combining—A Maximum-Likelihood Decoding Approach for Combining an Arbitrary Number of Noisy Packets," IEEE Transactions on Communications, vol. Comm-33, No. 5, pp. 385-393 (May 1985).

Chiang, Ping-Hung et al., "Performance of 2IMO Differentially Transmit-Diversity Block Coded OFDM Systems in Doubly Selective Channels," Global Telecommunications Conference, 2005, pp. 3768-3773 (Nov. 11, 2005).

Cole, C.A. et al., "Analysis and Design of Moderate Length Regular LDPC Codes with Low Error Floors," 2006 $40^{th}$ Annual Conference on Information Sciences and Systems, pp. 823-828 (Mar. 22-24, 2006).

Kim, Woo Tai et al., "Performance of STBC with Turbo Code in HARQ Scheme for Mobile Communication Systems," Telecommunications 2003, ICT 2003, 10th International Conference, pp. 85-59 (Feb. 23, 2003).

Koike, T. et al., "Hybrid ARQ scheme suitable for coded MIMO transmission," Communications, IEEE International Conference, Paris, France, pp. 2919-2923 (Jun. 20, 2004).

Krishnaswamy, Dilip et al., "Multi-Level Weighted Combining of Retransmitted Vectors in Wireless Communications," IEEE VTC (Sep. 2006).

Nagareda, R. et al., "OFDM mobile packet transmission system with multiuser detection and metric combining ARQ," Vehicular Technology Conference, 2004 VTC2004-Fall, 2004 IEEE 60th Los Angeles, CA, USA, pp. 709-713 (Sep. 26, 2004).

Onggosanusi, Eko N. et al., "Hybrid ARQ Transmission and Combining for MIMO systems," 2003 International Conference on Communications, pp. 3205-3209 (May 11, 2003).

Samra, Harvind et al., "New MIMO ARQ protocols and joint detection via sphere decoding," IEEE Transactions on Signal Processing [online], pp. 473-482 (Feb. 28, 2006).

Samra, Harvind et al., "Sphere decoding for retransmission diversity in MIMO flat-fading channels," ICASSP IEEE Int. Conf. Acoust. Speech Signal Process [online], pp. 585-588 (May 17, 2004).

Schmitt, M.P., "Improved retransmission strategy for hybrid ARQ schemes employing TCM," Wireless Communications and Networking Conference, 1999 IEEE New Orleans, LA, pp. 1226-1228 (Sep. 21, 1999).

Tirkkonen, O. et al., "Square-Matrix Embeddable Space-Time Block Codes for Complex Signal Constellations," IEEE Trans. Info. Theory, vol. 48, pp. 384-395 (Feb. 2002).

Tong, Wen et al., "Soft packet combing for STC re-transmission to improve H-ARQ performance in MIMO mode," Proposal for IEEE 802.16 Broadband Wireless Access Working Group, pp. 1-5 (Jul. 7, 2004).

U.S. Appl. No. 12/327,627, filed Dec. 3, 2008, Varnica et al.

* cited by examiner $$H \cdot D = S$$
$$\quad\;\;202 \quad\;\; 204 \quad\; 206$$

FIG. 2A $$H = \begin{bmatrix} 1 & 1 & 0 & 0 & 1 \\ 1 & 0 & 1 & 0 & 0 \\ 0 & 0 & 1 & 0 & 1 \end{bmatrix}$$

| Trapping Sets (v, w) | # Classes | # Failures | Frequency (%) |
|---|---|---|---|
| (6, 2) | 10 | 2920 | 58.40 |
| (8, 2) | 8 | 879 | 17.58 |
| (10, 2) | 9 | 561 | 12.2 |
| (5, 3) | 21 | 425 | 8.50 |
| (7, 3) | 12 | 121 | 2.42 |
| (7, 1) | 19 | 57 | 1.14 |
| (12, 2) | 25 | 22 | 0.44 |
| (11, 1) | 7 | 5 | 0.1 |
| (8, 4) | 33 | 1 | 0.02 |
| (5, 5) | 17 | 1 | 0.02 |
| total | | | 99.84 |

FIG. 8

QC-LDPC DECODER WITH LIST-SYNDROME DECODING

CROSS-REFERENCE TO RELATED APPLICATIONS

This application is a continuation of commonly-assigned U.S. patent application Ser. No. 13/397,479, filed Feb. 15, 2012 (now U.S. Pat. No. 8,301,984), which is a continuation of U.S. patent application Ser. No. 12/180,229, filed Jul. 25, 2008 (now U.S. Pat. No. 8,127,209), which claims the benefit of U.S. Provisional Application No. 60/952,747, filed Jul. 30, 2007, which are each hereby incorporated by reference herein in their entirety.

BACKGROUND

In general, the invention relates to data processing. In particular, the invention relates to data processing in quasi-cyclic low density parity check (QC-LDPC) decoders.

With the continuing demand for high-reliability transmission of information in digital communication and storage systems, and with the rapid increase in available computational power, various coding and decoding techniques have been investigated and applied to increase the fidelity of these systems. One such coding technique, low-density parity check (LDPC) coding, was first proposed in the 1960s, but was not used until the late 1990s when researchers began to investigate iterative coding and decoding techniques.

LDPC codes form a class of linear block codes that are of particular interest due to their capability of approaching the Shannon limit for channel capacity. LDPC coding techniques are generally iterative in nature, and can be represented by many different types of parity check matrices. The structure of an LDPC code's parity check matrix can be, for example, random, cyclic, or quasi-cyclic. LDPC codes defined by quasi-cyclic parity check matrices are particularly common and computationally efficient. These codes are known as quasi-cyclic low density parity check (QC-LDPC) codes.

The performance capability of a coding scheme, such as a LDPC coding scheme, is often described by the code's performance curve, which is a plot of signal-to-noise ratios (SNR) vs. Bit Error Rate (BER) or Sector Error Rate (SER). The performance curve of LDPC codes generally consists of two regions: the waterfall region and the error floor region (see FIG. 3). In the waterfall region, the code's BER or equivalently, SER, decreases rapidly with improvements in SNR. However, in the high SNR operating region, the BER/SER disadvantageously plateaus to an error floor, meaning that further improvements in channel condition would not lead to lower BER/SER. Although the error floors of well designed LDPC codes are generally low, they might not be acceptable for communication channels that must guarantee high degree of data reliability.

SUMMARY

Accordingly, a system and method for reducing the error floor of LDPC codes, and QC-LDPC codes in particular, are disclosed. A decoder constructed in accordance with the principles of the present invention may include a primary iterative decoding stage followed by additional processing stages. The additional processing stages may be implemented using any suitable type of decoding circuitry, logic, or software, and may be configured to decode codewords that the iterative decoder failed to decode due to the existence of trapping sets. Trapping sets are sets of erroneous bits that result in few unsatisfied checks, and therefore cannot be iteratively decoded.

The decoding circuitry may utilize a trapping set look-up table storing the syndrome pattern and error pattern of one trapping set member of each of several trapping set classes. The trapping set classes represented in the look-up table may have members that are commonly occurring trapping sets. For example, the stored trapping set classes may include those trapping sets that, of all possible trapping sets, are most likely to occur.

The decoding circuitry may calculate the syndrome pattern c of a received codeword that was not successfully decoded by the iterative decoder. Using syndrome pattern c, the decoding circuitry may search the look-up table for a responsible trapping set class. This trapping set class may be the class that is most likely responsible for the iterative decoder's failure. The responsible trapping set class may be characterized by having a trapping set member, the most likely responsible trapping set, whose syndrome pattern is equal to c. Thus, in one embodiment, the decoding circuitry may compare c to the syndrome patterns stored in the look-up table. Although the syndrome pattern of only one member of each trapping set class is stored in the look-up table, the syndrome patterns of the remaining members of the represented trapping set classes may be calculated and compared to c as well. In one embodiment, applying quasi-cyclic shifts to the known syndrome pattern of one member of a trapping set class can produce the syndrome patterns of the remaining members. The process of searching the look-up table for the responsible trapping set class may be simplified by proving a look-up table indexed by syndrome weight.

If the responsible trapping set class is found in the look-up table, the decoding circuitry may retrieve the syndrome pattern c' and error pattern b' that are stored in the look-up table in connection with the responsible trapping set class. The decoding circuitry may then calculate the error pattern b of the received codeword based on its syndrome pattern c, and the syndrome pattern c' and error pattern b' obtained from the look-up table. In one embodiment where syndrome patterns c and c' have a quasi-cyclic shift difference of Δ, applying a quasi-cyclic shift of magnitude Δ to b' can produce the desired error pattern b.

With knowledge of b, which lists the locations of the erroneous bits in the received codeword, the decoding circuitry can correct the erroneous bits of the received codeword. For example, the decoder can then invert the erroneous bits and successfully correct the received codeword. By successfully decoding received codewords that are normally uncorrectable by iterative decoding, the decoder constructed in accordance with the present invention can advantageously lower the error floor.

BRIEF DESCRIPTION OF THE DRAWINGS

The above and other aspects and advantages of the invention will be apparent upon consideration of the following detailed description, taken in conjunction with the accompanying drawings, in which like reference characters refer to like parts throughout, and in which:

FIG. 2A is a mathematical vector model of an LDPC code with parity check matrix H;

FIG. 2B is an illustrative parity check matrix H;

FIG. 2C is a Tanner graph of the illustrative parity check matrix of FIG. 2B;

FIG. 8 is a table illustrating the error floor lowering capacity of the decoder in FIG. 6;

DETAILED DESCRIPTION

The disclosed technology is directed toward systems and methods for QC-LDPC decoding that lead to advantageously lowered error floors. In applications or devices where information may be altered by interference signals or other phenomena, error-correction codes, such as LDPC codes, can provide a measured way to protect information against such interference. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
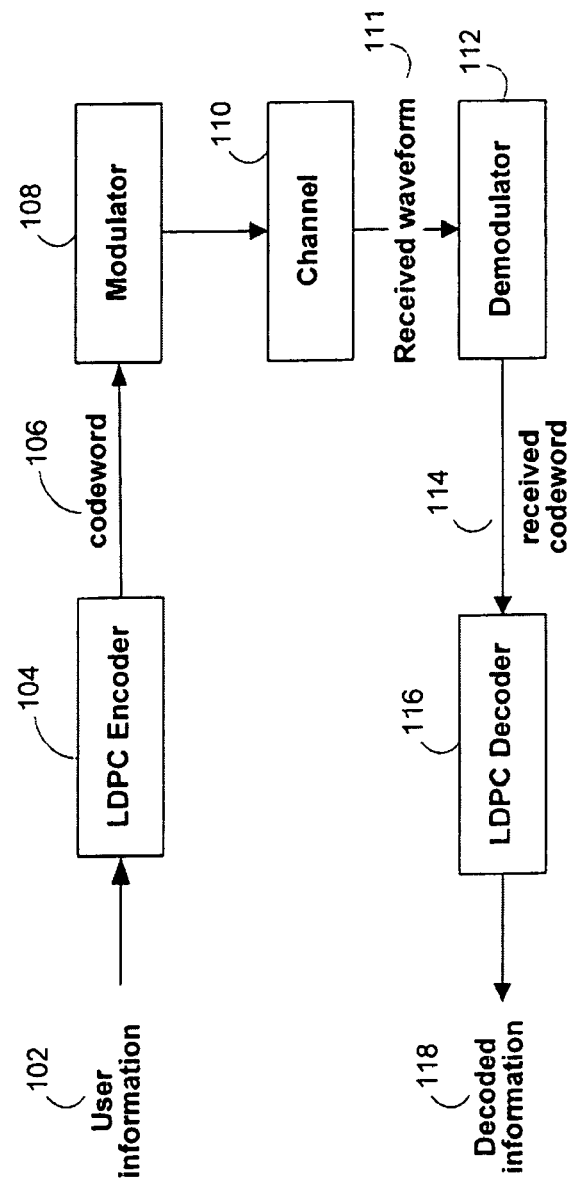
FIG. 1 is an illustrative block diagram of an error-correcting communication/storage system in accordance with one aspect of the invention.

Referring to FIG. 1, there is shown an illustrative communication or data storage system 100 that utilizes error-correction codes for achieving reliable communication or storage. User information 102 is encoded through encoder 104. User information 102, often referred to as the message information or a message vector, may be grouped into units of k symbols, where each symbol may be binary, ternary, quaternary, or any other suitable type of data. However, for simplicity, embodiments of the present invention will be described in terms of binary bits. In the process of encoding user information 102, different codes can be used by encoder 104 to achieve different results.

As shown in FIG. 1, encoder 104 may encode user information 102 using a low density parity check (LDPC) code. The result of encoding user information 102 is codeword 106, also denoted as c. Codeword 106 may be of a predetermined length, which may be referred to as n.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals.

Channel 110 may be an asymmetric or symmetric channel. Channel 110 may represent media through which the information-carrying signals travel. For example, channel 110 may represent a wired or wireless medium in a communication system, or an electrical (e.g., RAM, ROM), magnetic (e.g., a hard disk), or optical (e.g., CD or DVD) storage medium in which the information-carrying signals can be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 can demodulate received waveform 111 with filters, multiplication by periodic functions, or any suitable demodulation technique corresponding to the type of modulation used in modulator 108. The result of demodulation is received codeword 114, which may contain errors due to channel corruption.

Received codeword 114 may then be processed by decoder 116. Decoder 116 can be used to correct or detect errors in received codeword 114. Decoder 116 may have two stages, where one stage uses an iterative message-passing decoding algorithm and the other stage uses a list-syndrome based decoding algorithm. The iterative message-passing decoding algorithm may be, for example, an iterative belief propagation algorithm or a sum-product algorithm. When utilizing such an iterative algorithm, decoder 116 may perform several iterations of the algorithm until the output of decoder 116 converges to a valid codeword. In some scenarios, the output of decoder 116 may fail to converge to a valid codeword. Decoder failure may be caused by a variety of reasons, which will be discussed further below. Because the output of decoder 116 may never converge to a valid codeword in certain situations, decoder 116 may be equipped with a maximum iteration limit, which can be any suitable predetermined number. When decoder 116 reaches the maximum iteration limit, decoder 116 may automatically terminate operation and move on to the next received codeword 114. However, if the output of decoder 116 successfully converges to a valid codeword, decoder 116 may then output decoded information 118.

The LDPC codes embodied by encoder 104 and decoder 116 are conventionally represented by mathematical vector models. In particular, an LDPC code can be described by its parity check matrix H. Referring now to FIG. 2A, there is shown a vector model 200 of an LDPC code relating parity check matrix 202, codeword 204, and syndrome 206, where codeword 204 and syndrome 206 are vectors. Syndrome 206 is equal to the null vector if and only if codeword 204 is a valid codeword. Codeword 204 may be, for example, n-length codeword 106 or n-length received codeword 114 of FIG. 1. When codeword 204 has length n and syndrome 206 has length r, parity check matrix 202 may have dimensions r×n. Syndrome length r may satisfy the inequality r≥n−k and where k is the length of the information being encoded (e.g., length of user information 102 of FIG. 1).

An LDPC code may also be graphically represented as a Tanner graph, a bipartite graph showing the relationship between a LDPC code's codeword bits and syndrome bits. The advantages of using a Tanner graph representation of a LDPC code include access to efficient graph-based message-passing algorithms for decoding. An exemplary 3×5 parity check matrix 210 is shown in FIG. 2B, and its corresponding Tanner graph 220 is shown in FIG. 2C. Parity check matrix 210 may be used with five-bit codewords and may produce three-bit syndromes. Nodes 212-214 of Tanner graph 220 correspond to each bit of the three-bit syndromes produced by matrix 210, and are referred to as the Tanner graph's check nodes. Nodes 215-219 correspond to the five-bit codewords that may be used with matrix 210, and are called the Tanner graph's bit nodes. The undirected edges connecting various check nodes with bit nodes correspond to the locations of the non-zero entries of matrix 210. In other words, parity check matrix 210 is the adjacency matrix of Tanner graph 220. For example, the 1 at the (1,2) location of matrix 210 indicates that there is an edge between check node 212 and bit node 216, while the 0 at the (1,3) location indicates that there is no edge between check node 212 and bit node 217.

The check nodes of a Tanner graph can either be satisfied or unsatisfied, where a satisfied node has a binary value of 0 and an unsatisfied node has a binary value of 1. A check node is satisfied (i.e., equal to 0) if the values of the bit nodes connected to the check node sum to an even number. In other words, the value of each check node is equal to the sum modulo two of the values of the bit nodes to which it is connected. For example, check node 212 of illustrative Tanner graph 220 would be satisfied if the values of bit nodes 215 and 216 were both 1 or both 0. Furthermore, when a check node is unsatisfied, at least one of the bit nodes connected to it is in error. Thus, the values of check nodes 212-214 (or equivalently, the value of the syndrome produced by matrix 210) provide a parity check on each codeword received by a LDPC decoder (i.e., decoder 116 of FIG. 1), thereby providing error correction capability to communication/storage system 100 of FIG. 1.

Figure 3:
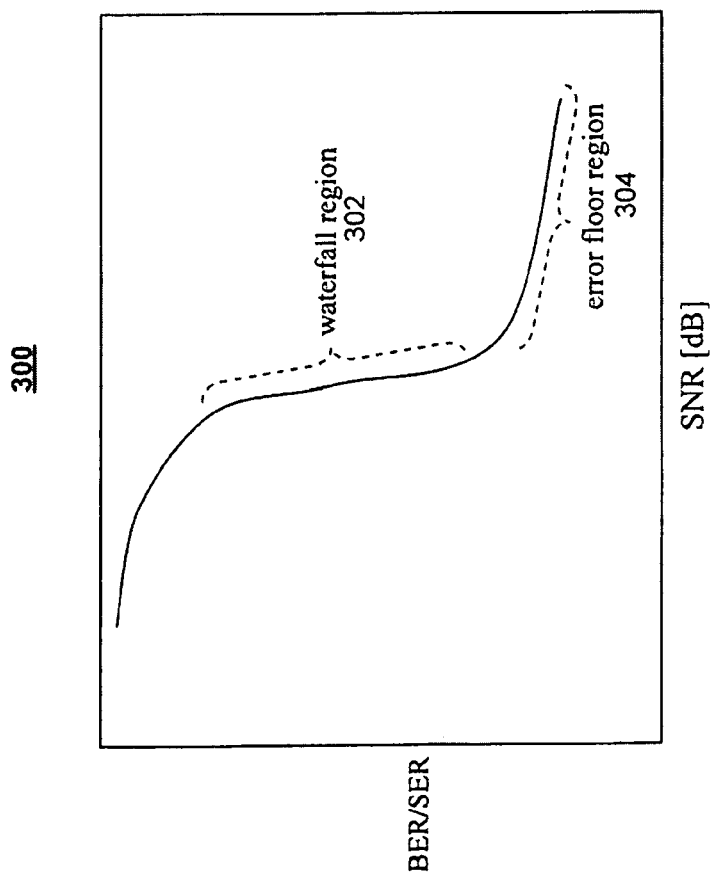
FIG. 3 is a performance curve of an exemplary LDPC code.

As mentioned previously, the performance capability of LDPC codes, as described by a mapping of SNR vs. BER/SER, generally comprises two regions of operation: the waterfall region and the error floor region. FIG. 3 shows an exemplary LDPC performance curve 300 with waterfall region 302 and error floor region 304. In error floor region 304, the BER/SER of the LDPC code disadvantageously asymptotes to a lower limit. Because the normal operating conditions for a communication/storage channel generally correspond to the error floor region 304, lowering error floor 304 can improve the performance of the LDPC code.

The asymptotic behavior of performance curve 300 in error floor region 304 is at least partially due to the existence of trapping sets in LDPC codes. Referring back to the Tanner graph representation of LDPC codes, as described above in connection with FIG. 2C, trapping sets are subgraphs of the Tanner graph of a LDPC code that cause decoder failure. Trapping sets contain the erroneous bit nodes that remain uncorrected even after the maximum number of iterations (of a belief propagation algorithm, for example) is performed by a decoder, such as decoder 116 of FIG. 1. The number of such bit nodes may be small, because the iterative decoder typically fails for few bits after performing the maximum number of iterations. Thus, the trapping set may include a small number of the total bit nodes in the Tanner graph for the LDPC code, along with the check nodes that are connected to the erroneous bits.

Figure 4:
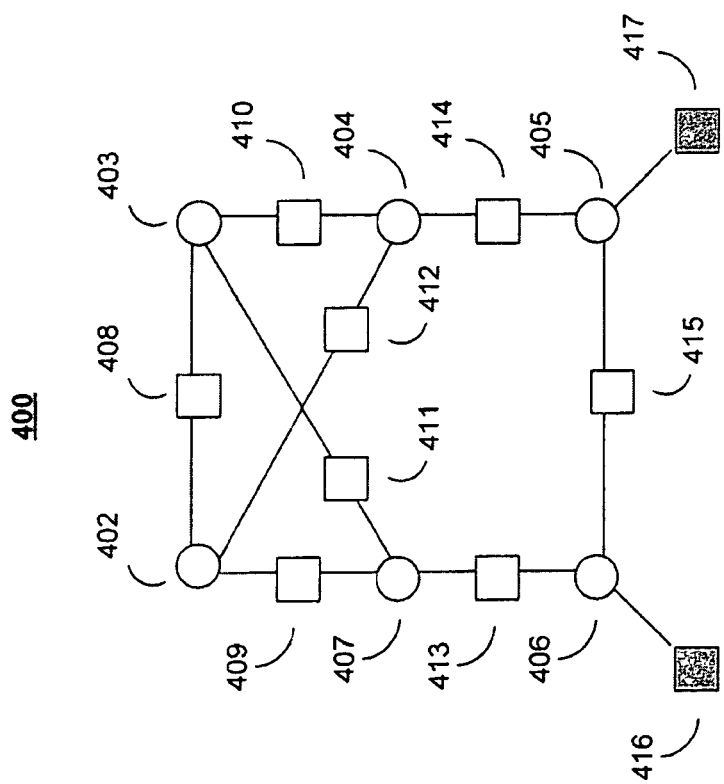
FIG. 4 is an illustrative trapping set.

An illustrative trapping set 400 is shown in FIG. 4. Trapping set 400 comprises satisfied check nodes 408-415, unsatisfied check nodes 416-417, and uncorrected bit nodes 402-407. Trapping set 400 is referred to as a (6,2) trapping set because there exists six erroneous bit nodes and two unsatisfied check nodes. This nomenclature may be generalized to indicate trapping sets with v erroneous bit nodes and w unsatisfied check nodes as a (v,w) trapping set. The number of unsatisfied check nodes w is also called the syndrome weight of the trapping set.

Figure 5:
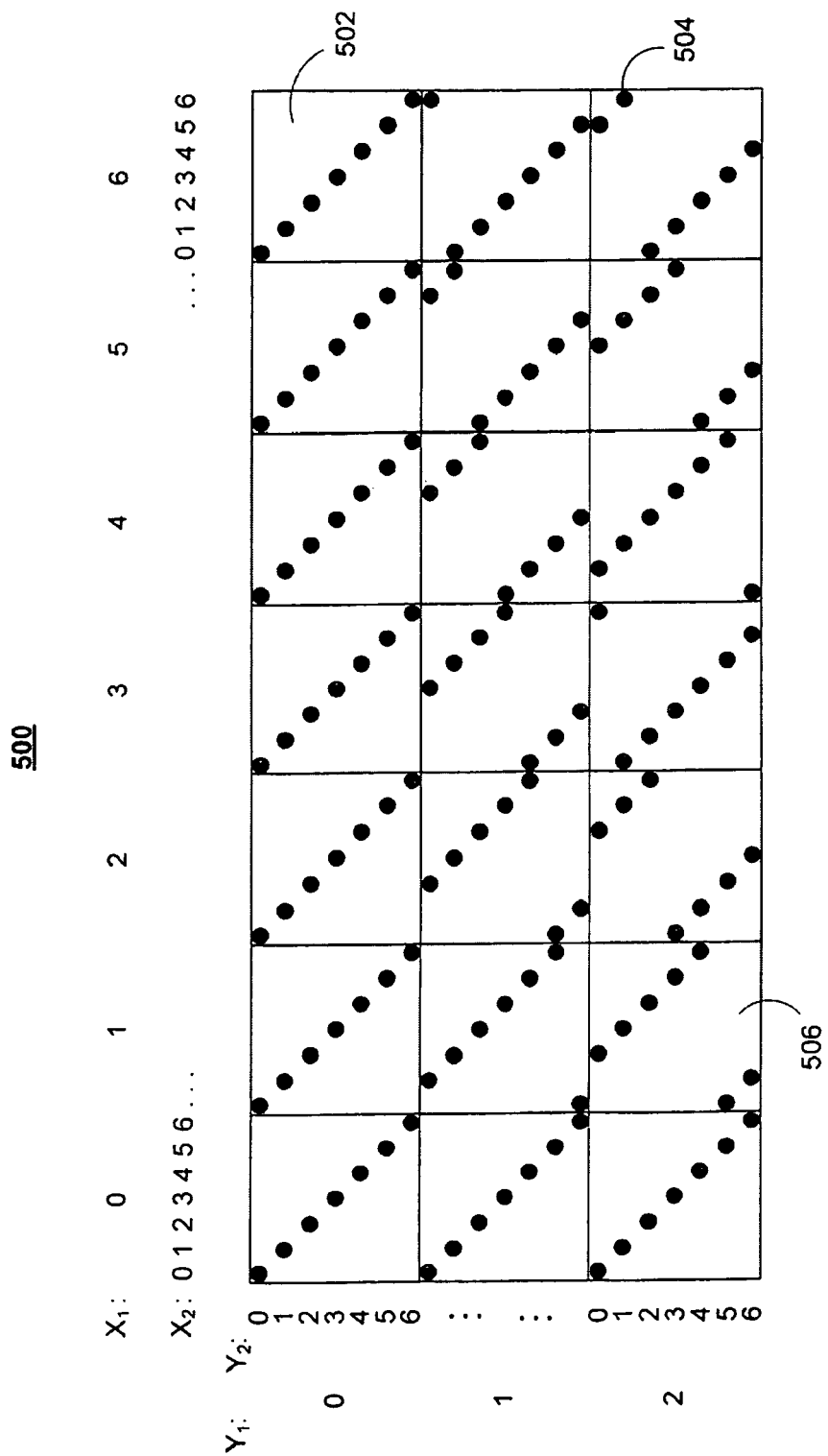
FIG. 5 an illustrative parity check matrix of a QC-LDPC code.

Because trapping sets are largely responsible for the existence of error floors in LDPC codes, providing decoding methods that can correct errors caused by trapping sets is imperative for lowering the error floor. Advantageously, trapping sets of one type of LDPC code, QC-LDPC codes, have special properties that may be used to efficiently lower the error floor. As mentioned previously, QC-LDPC codes are a commonly used type of LDPC codes. QC-LDPC codes are computationally efficient, and are thus desirable for hardware implementation of decoders. For example, LDPC encoder 104 and LDPC decoder 116 of FIG. 1 can preferentially employ a QC-LDPC code. QC-LDPC codes are characterized by parity check matrices that are quasi-cyclic. A quasi-cyclic matrix can be composed of a plurality of Z×Z circular sub-matrices known as circulants. FIG. 5 shows an illustrative quasi-cyclic matrix 500 that may serve as the parity check matrix of a QC-LDPC code. Illustrative quasi-cyclic matrix 500 is composed of twenty-one 7×7 circulants (e.g., circulants 502 and 506). Each dot 504 represents a 1 entry in matrix 500. The remaining (not shown) entries of matrix 500 are 0. Thus, matrix 500 is a sparse matrix. Each circulant is either an identity matrix, such as matrix 502, or a cyclic shift of the identity matrix, such as matrix 506. For example, each entry of matrix 506 is cyclically shifted two columns to the right from the identity matrix.

Trapping sets of QC-LDPC codes can be advantageously represented in node index notation, which uses vectors b and c to store the locations of uncorrected bits and unsatisfied checks, respectively. For a (v,w) trapping set, b may be a v-length vector listing the vector indices of the uncorrected bits in a codeword vector (e.g., received codeword 114 of FIG. 1). For example, if the third bit in a received codeword is the first erroneous bit due to the trapping set, then the first entry of b may be 2 (vector indices generally begin at 0). Similarly, vector c may be a w-length vector listing the vector indices of the unsatisfied checks in a syndrome vector (e.g., syndrome 206 of FIG. 2). Notice that the entries of codeword vectors and syndrome vectors are generally binary if a binary code is used. However, the elements of vectors b and c are index numbers and therefore generally not binary. Vectors b and c are referred to as the error pattern and syndrome pattern, respectively.

In some scenarios, it may be advantageous to express the elements of b and c in terms of the row and column indices of the parity check matrix of a QC-LDPC code. For example, with reference to matrix 500, the columns of matrix 500 are indexed by a "mother code index" $x_m$ and a "circulant index" $x_c$. Mother code index $x_m$ indexes the number of circulants that compose the columns of matrix 500. Circulant index $x_c$ indexes the number of columns within each circulant. Circulant index $x_c$ restarts from 0 with each new circulant. For example, in FIG. 5, both $x_m$ and $x_c$ can range from 0 and 6. Thus, each element of b, b[j] for j={0, 1, 2, ... v−1}, of a (v,w) trapping set associated with matrix 500 can be expressed by the following equation:

$$b[j] = x_m[j] * Z + x_c[j] \; j = \{0,1,2, \ldots v-1\}, \quad (\text{Eq. 1})$$

where Z×Z is the circulant dimension of matrix 500, and $x_m[j]$ and $x_c[j]$ are respectively the mother code index and the circulant index associated with erroneous bit node b[j]. The v mother code and circulant indices associated with the elements of b may be collectively referred to as vectors $x_m$ and $x_c$.

The indexing for the rows of matrix 500 follow an analogous pattern. More specifically, mother code index $y_m$ indexes the number of circulants that compose the rows of matrix 500, and circulant index $y_c$ indexes the number of rows within each circulant. Each element of c, c[i] for i={0, 1, 2, ... w−1}, of the (v,w) trapping set is thus analogously expressed by the following equation:

$$c[i] = y_m[i] * Z + y_c[i] \quad i = \{0,1,2,\ldots w-1\}, \quad (\text{Eq. 2})$$

where the w mother code indices and w circulant indices for the rows of matrix 500 are collectively referred to as $y_m$ and $y_c$, respectively.

The Tanner graph of a QC-LDPC code with Z×Z circulants is said to have an automorphism of size Z. In other words, for any subgraph corresponding to a trapping set, Z−1 other subgraphs with the same properties and structure exist, and which correspond to Z−1 other trapping sets. Thus, if one can find a single (v,w) trapping set of QC-LDPC code, then there exists a class of Z (v,w) trapping sets, where each member of the class may be constructed by quasi-cyclically shifting another member of the class. A quasi-cyclic shift by Δ of a trapping set represented by error pattern b and syndrome pattern c is defined as follows:

$$b[j]' = x_m[j] * Z + \mathrm{mod}(x_c[j]+\Delta, Z) \quad (\text{Eq. 3})$$

$$c[i]' = y_m[i] * Z + \mathrm{mod}(y_c[i]+\Delta, Z), \quad (\text{Eq. 4})$$

where b' and c' are the error pattern and syndrome pattern of the newly constructed trapping set, respectively, and where Δ={0, 1, 2, ... Z−1}.

Because knowledge of the error pattern and syndrome pattern of one member of a trapping set class is sufficient for generating the error pattern and syndrome pattern of each of the other class members, QC-LDPC trapping sets may be compactly stored in memory by only storing the error pattern and syndrome pattern of one class member. It is advantageous to know the error and syndrome patterns of trapping sets because they may be used to locate and correct bits that are uncorrectable by iterative decoding techniques. Thus, in one embodiment of the invention, trapping sets are stored in memory to prevent decoder failures due to trapping sets.

Figure 6:
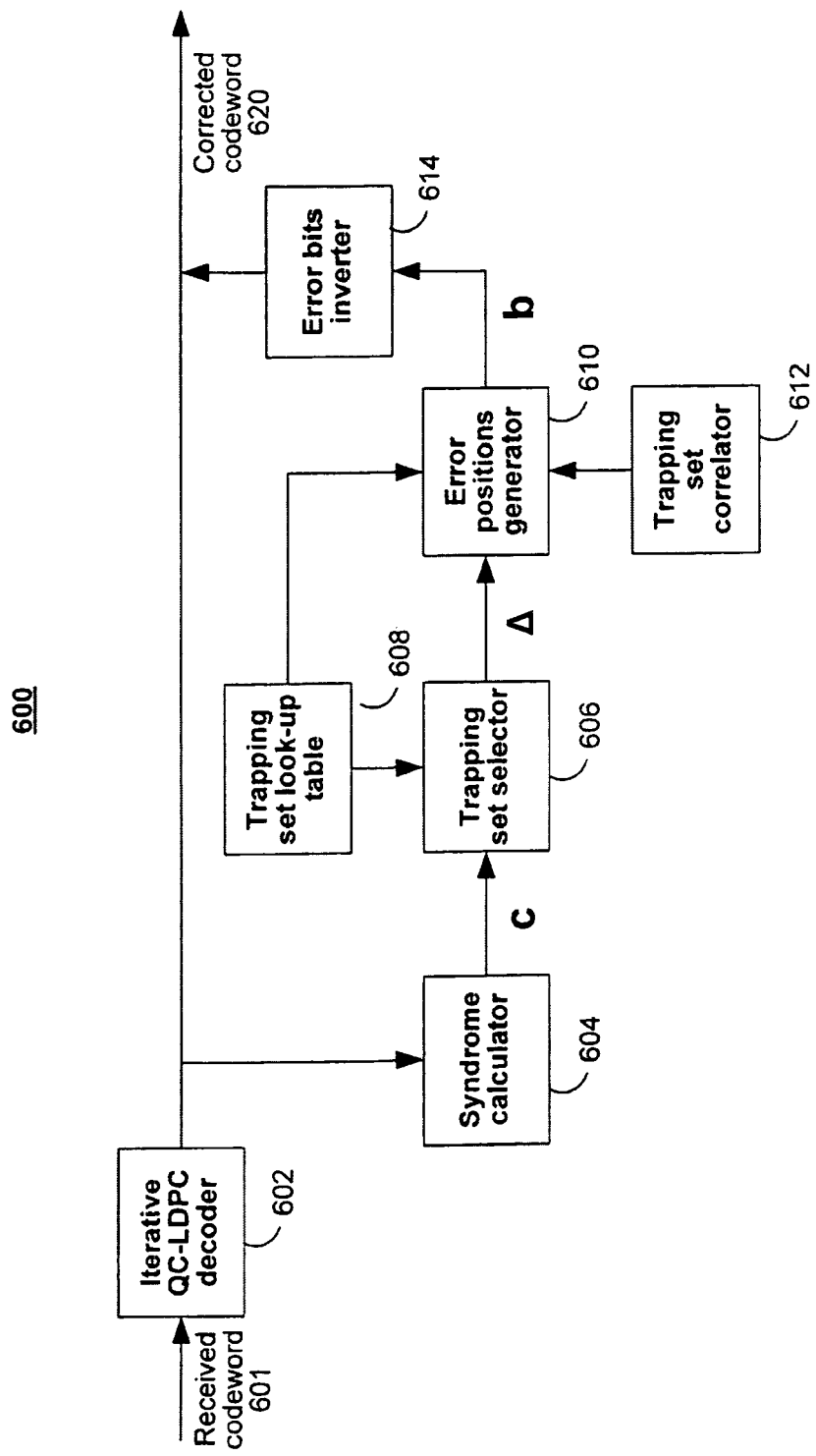
FIG. 6 is a high level block diagram of an error floor reducing decoding system in accordance with one aspect of the invention.

Referring now to FIG. 6, there is shown a block diagram of a QC-LDPC decoder 600 that utilizes the memory-saving properties of QC-LDPC trapping sets described above to reduce the error floor of the decoder. In particular, decoder 600 uses a trapping set look-up table 608, where commonly occurring trapping sets are stored, in the event that iterative QC-LDPC decoder 602 fails. Decoder 600 may be used to implement LDPC decoder 116 of FIG. 1.

Iterative QC-LDPC decoder 602, the first stage of decoder 600, takes as input received codeword 601. Received codeword 601 may be, for example, received codeword 114 of FIG. 1. Because received codeword 601 may have traveled through a corrupting channel such as channel 110 of FIG. 1, received codeword 601 may not be a valid codeword of the QC-LDPC code employed by decoder 600. Iterative decoder 602 may apply a standard iterative QC-LDPC decoding algorithm to received codeword 601, such as a message-passing algorithm, to correct the errors in received codeword 601. Iterative decoder 602 may operate until its output converges to a valid codeword, which it may then output as corrected codeword 620. However, the output of iterative decoder 602 may fail to converge to a valid codeword due to the existence of trapping sets. If the output of iterative decoder 602 fails to converge, iterative decoder 602 may automatically terminate operation when it reaches a maximum iteration limit. Iterative decoder 602's maximum iteration limit may be hardwired or programmable.

In the case that iterative decoder 602 fails and the maximum number of iterations is performed, operation of decoder 600 may then proceed to syndrome calculator 604, which may be implemented using a linear feedback shift register (LFSR) or another appropriate hardware or software system. In some embodiments, syndrome calculator 604 may calculate the syndrome vector (i.e., s of FIG. 2A) or syndrome pattern (i.e., c) of received codeword 601. In other embodiments, syndrome calculator 604 may calculate the syndrome vector or pattern using the output of iterative decoder 602. Because syndrome calculator 604 may only operate if the output of iterative decoder 602 fails to converge, the syndrome vectors/patterns that syndrome calculator 604 produce may be non-zero. In embodiments where syndrome calculator 604 operates on the output of iterative decoder 602, iterative decoder 602 may have corrected all of the errors in received codeword 601 that were not caused by a trapping set. The non-zero syndrome vectors/patterns may therefore be solely due to any remaining errors from a trapping set. If syndrome calculator 604 produces a binary syndrome vector, the syndrome vector may first be converted into a syndrome pattern before further processing. The conversion may be accomplished using a simple loop and counter algorithm, for example. For simplicity, FIG. 6 shows syndrome calculator 604 outputting the syndrome pattern c of received codeword 601.

The next stage of decoder 600, trapping set selector 606, may use syndrome pattern c and a trapping set look-up table 608 to determine the trapping set and trapping set class that most likely caused iterative decoder 602 to fail to decode received codeword 601. Trapping set look-up table 608 can be a table stored in memory (e.g., a ROM) that contains a listing of dominant trapping sets of the QC-LDPC code employed by decoder 600. Dominant trapping sets may be the trapping sets that occur most frequently and/or cause the greatest number of failures in a traditional iterative QC-LDPC decoder, such as iterative decoder 602.

Figure 7:
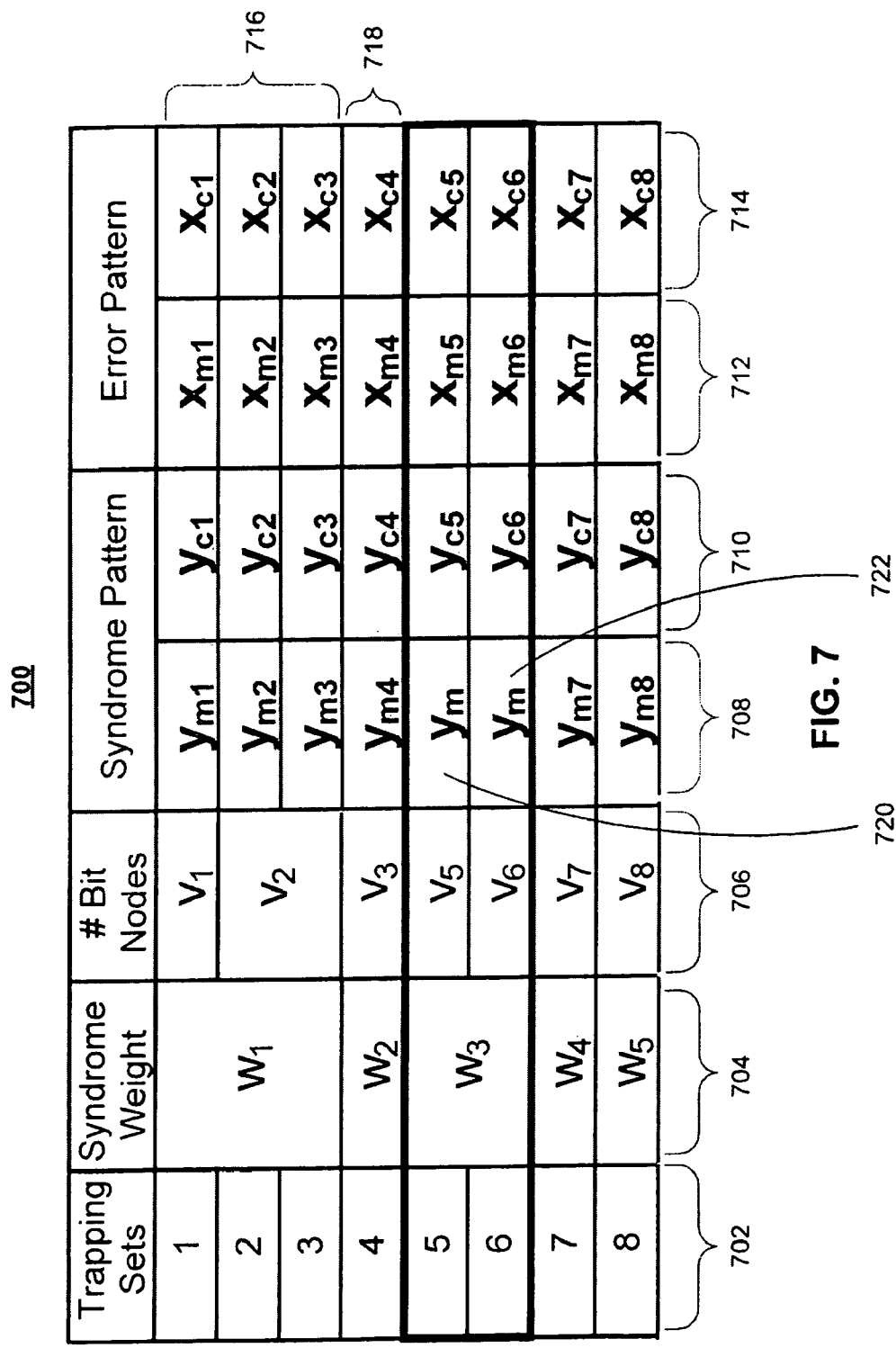
FIG. 7 is an illustrative trapping set look-up table.

An exemplary trapping set look-up table 608 is shown in FIG. 7 as table 700. The rows of table 700 list the syndrome pattern and error pattern of a each of several dominant trapping sets. For exemplary purposes, table 700 lists eight dominant trapping sets, as shown in column 702. The trapping sets listed in table 700 are indexed by syndrome weight w, the number of unsatisfied check nodes in a trapping set. As shown in column 704, trapping sets with the same syndrome weight (e.g., trapping sets 1-3) are stored together in a sub-table 716. Some sub-tables, such as sub-table 718, may only contain one trapping set entry. In some embodiments, the order in which the sub-tables are listed in table 700 may be in numerical order dependent on the syndrome weight. For example, $w_1$ may be the lowest number in column 704 and $w_5$ may be the highest. In other embodiments, the sub-tables may be arranged in another order. Column 706 of table 700 lists the number of uncorrected bits in each trapping set. Together, columns 704 and 706 provide a data pair (v,w) that at least partially identifies the trapping set class in which each trapping set listed in table 700 belongs. In order to conserve memory, only one trapping set per trapping set class may be listed in table 700. The other members of each trapping set class may be obtained by quasi-cyclically shifting the trapping set member that is listed in table 700.

Also listed in table 700 for each trapping set entry are the row mother code and circulant indices, in columns 708 and 710, respectively, and the column mother code and circulant indices, in columns 712 and 714, respectively. The row mother code and circulant indices in columns 708 and 710 may be used to calculate the syndrome pattern of each trapping set listed in table 700 via Equation 2. Similarly, the column mother code and circulant indices in columns 712 and 714 may be used to calculate the error pattern of each trapping set entry via Equation 1.

As illustrated by trapping sets 2 and 3 in table 700, two or more trapping sets may have the same (v,w) pair but belong in different classes. In particular, trapping sets 2 and 3 are shown to have $v_2$ erroneous bit nodes and a syndrome weight of $w_1$. Trapping sets 2 and 3 therefore are not related in the manner described in connection Eq. 3 and Eq. 4, and may be distinguished from each other based on the location of their erroneous bit nodes and unsatisfied checks (e.g., from columns 708, 710, 712, and/or 714 in table 700).

Referring again to FIG. 6, trapping set selector 606 may use table 700 to determine the trapping set and trapping set class that is most likely responsible for iterative decoder 602's decoding failure. In one embodiment, trapping set selector 606 determines the responsible trapping set by comparing syndrome pattern c of received codeword 601 to the syndrome patterns listed in table 700. In particular, trapping set selector 606 may first check if the syndrome weight of syndrome pattern c is listed in table 700. If table 700 is organized such that the syndrome weights in column 704 are in numerical order, trapping set selector 606 may initially check if the syndrome weight of c is within the range bounded by $w_1$ and $w_5$ of column 704.

If the syndrome weight of c is present in table 700, trapping set selector 606 may then compare the mother code vector $y_m$ of received codeword 601 to the mother code vectors listed in column 708. If at least one matching mother code vector is found in column 708, such as entries 720 and 722, then trapping set selector 606 may continue operation. Two syndrome patterns with equal two mother code vectors may be in the same trapping set class. If no match is found, trapping set selector 606 may abort operation and decoder 600 may start processing on the next received codeword. In the former scenario, for each entry in column 708 that is equal to $y_m$, trapping set selector 606 may retrieve the corresponding column circulant vector (i.e., $y_{c5}$ and $y_{c6}$). Trapping set selector 606 may then calculate the quasi-cyclic shift difference between the first check node of c and the first check node of each trapping set listed in table 700 whose mother code vector equals $y_m$ (i.e., trapping sets 5 and 6). Lastly, trapping set selector 606 may apply the respectively calculated shift differences to $y_{c5}$ and $y_{c6}$, and determine if any of the resulting syndrome patterns equals c. Suppose for illustrative purposes that applying shift difference $\Delta$ to $y_{c5}$ generates a syndrome pattern $y_m*Z+\mathrm{mod}(y_{c5}+\Delta, Z)$ that is equal to c. Then trapping set 5 and the trapping set responsible for iterative decoder 602's failure may be in the same class (i.e., the responsible trapping set class), and quasi-cyclically shifting trapping set 5 by $\Delta$ may produce the responsible trapping set. The syndrome pattern and error pattern stored in table 700 in connection with the responsible trapping set class may be generally referred to as c' and b', respectively.

In some scenarios, trapping set selector 606 may not be able to find a responsible trapping set using table 700. This may be because the responsible trapping set class is not represented in table 700 or the errors in the received codeword were not caused by a trapping set. In this case, decoder 600 might not be able to correct received codeword 601 and may abort operation. The success rate of decoder 600 is highly dependent on the size of table 700. The responsible trapping set is more likely to be listed in a larger look-up table than a smaller table. However, larger tables require more hardware resources, like memory. Therefore, the size of table 700 is a trade-off between decoder performance and available resources.

Referring back to FIG. 6 and the illustrative example above, trapping set selector 606 may output the quasi-cyclic shift difference $\Delta$ calculated for trapping set 5 to the next stage of decoder 600, error positions generator 610. Error positions generator 610 may then retrieve from table 700 the mother code vector $x_{m5}$ and circulant vector $x_{c5}$ associated with trapping set 5 to compute the error pattern b of the responsible trapping set. Error positions generator 610 may calculate error pattern b by applying a quasi-cyclic shift of magnitude $\Delta$ to $x_{c5}$. Thus, $x_{c5}$ and $y_{c5}$ are shifted by the same amount.

As mentioned previously, table 700 may store the syndrome and error patterns of one trapping set per trapping set class. Generally, decoder 600 may determine the class in which the responsible trapping set is in, and calculate from the syndrome pattern representing the responsible class in table 700 a shift difference $\Delta$ between the listed syndrome pattern and the responsible trapping set's syndrome pattern. The same $\Delta$ is then applied on the error pattern of the listed trapping set to compute the error pattern b of the responsible trapping set. Thus, error pattern b may be obtained even if it is not directly stored in table 700.

Error pattern b advantageously lists the locations of the erroneous bits in received codeword 601. Thus, decoder 600 may invert the erroneous bits in received codeword 601, as indicated by error pattern b, to produce corrected codeword 620. This step may be performed by error bits inverter 614, the last stage of decoder 600. Error bit inverter 614 may contain software that loops through received codeword 601 to invert bits in accordance with the index location numbers listed in b.

Sometimes there may be two or more trapping sets that have the same syndrome pattern. For example, if $y_{c5}$ and $y_{c6}$ in table 700 were equal, then trapping sets 5 and 6 of table 700 may have the same syndrome pattern. In these scenarios, trapping set selector 606 and error positions generator 610 may operate on both trapping sets to find two potential error patterns. To select between the resulting error patterns, trapping set correlator 612 may use any of a variety of suitable correlation criteria. In some embodiments, trapping set correlator 612 may compute the log likelihood ratio (LLR) for corresponding error bits in each error pattern, and may use a log likelihood ratio (LLR) criteria. For example, trapping set correlator 612 may operate based on the assumption that the LLR of the true error bit has a smallest magnitude. Thus, in one embodiment, trapping set correlator 612 may calculate the sum of the magnitudes of the LLR of the error bits for each potential trapping sets, and may select the trapping set with the smallest sum.

In another embodiment, trapping set correlator 612 may compare the magnitude of the LLR of each error bit of the potential trapping sets to a predetermined threshold. Trapping set correlator 612 may then select the trapping set with the largest number of bits whose LLR is less than the threshold. In still another embodiment, trapping set correlator 612 may compute the LLR of the error bits before decoding and the resulting LLR after decoding. For example, for each error bit in an error pattern, trapping set correlator 612 can multiply the LLR of the error bits before decoding (i.e., a priori LLR) with the LLR after decoding (i.e., a posteriori LLR). Then, the sum of these multiplications for all the error bits can be calculated. This summation may indicate a correlation between the a priori LLRs and a posteriori LLRs. Finally, the calculated sums of the LLRs for different potential error patterns can be compared and the one with the smallest value may be selected. This is because the a priori LLR of an error bit will generally have either a small magnitude or an opposite sign as the a posteriori LLR, while the a posteriori LLR of an error bit will generally will have a large magnitude. Thus, the actual error pattern should have the smallest sum as compared to the other potential error patterns.

There may be several methods for generating trapping set look-up tables for use with decoder 600, such as table 700 (or equivalently, table 608). For example, table 700 may be populated by expert knowledge. An appropriate search algorithm and importance sampling method may also be used to search the Tanner graph to identify trapping sets. In a preferred embodiment, table 700 is generated by running a simulation of the employed QC-LDPC code. The simulation may feed randomly generated codewords subjected to additive white Gaussian noise through an iterative decoder, such as iterative decoder 602. The resulting syndrome patterns and error patterns (which are known because the original uncorrupted codeword is known), and their associated trapping sets, can then be stored in table 700. The simulation may also provide statistics on the number of decoder failures that can be attributed to particular trapping sets. In this way, the dominant trapping set classes of the QC-LDPC code can be determined and preferentially stored in table 700 over less important trapping set classes.

The performance of decoder 600 may be highly dependent on the size of trapping set look-up table 700. A look-up table containing a large number of trapping sets may allow better decoder performance than a look-up table with a smaller number of trapping sets because the former may cover more iterative decoder failure scenarios. However, memory constraints of the hardware on which table 700 is implemented (e.g., a ROM) may preclude look-up tables beyond a certain size. Thus, there is a trade off between the size of table 700 and the performance of decoder 600.

FIG. 8 illustrates through table 800 the relationship between the performance of an illustrative QC-LDPC decoder and its dominant trapping sets when the decoder is operating at a BER/SER of around $10^{-8}$. The data in table 800 may be obtained by running the illustrative decoder on a large sample of randomly corrupted codewords. Column 802 of table 800 lists the v and w of ten dominant trapping sets of the illustrative QC-LDPC code. Column 804 lists the number of trapping set classes having v bit nodes and w unsatisfied checks. As described above, each value of v and w may be associated with multiple trapping set classes, where each trapping set class has different bit node and check node locations. Column 806 lists the number of iterative decoder failures, from the total codeword sample, that may be attributed to each (v,w) trapping set in column 802. Column 808 lists the percentage of all iterative decoder failures accounted for by each trapping set. For the illustrative example shown in table 800, nearly all (i.e., 99.84%) of the iterative decoder failures caused by trapping sets can be attributed to merely 161 dominant trapping set classes. In other words, using table 800, decoder 600 of FIG. 6 may successfully correct 99.84% of the received codewords that cannot be iteratively corrected. Thus, utilizing modestly-sized memory components, decoder 600 can substantially improve the decoding capability of standard iterative QC-LDPC decoders, such as iterative decoder 602 of FIG. 6, and thereby lower the error floor of QC-LDPC codes.

Figure 9A:
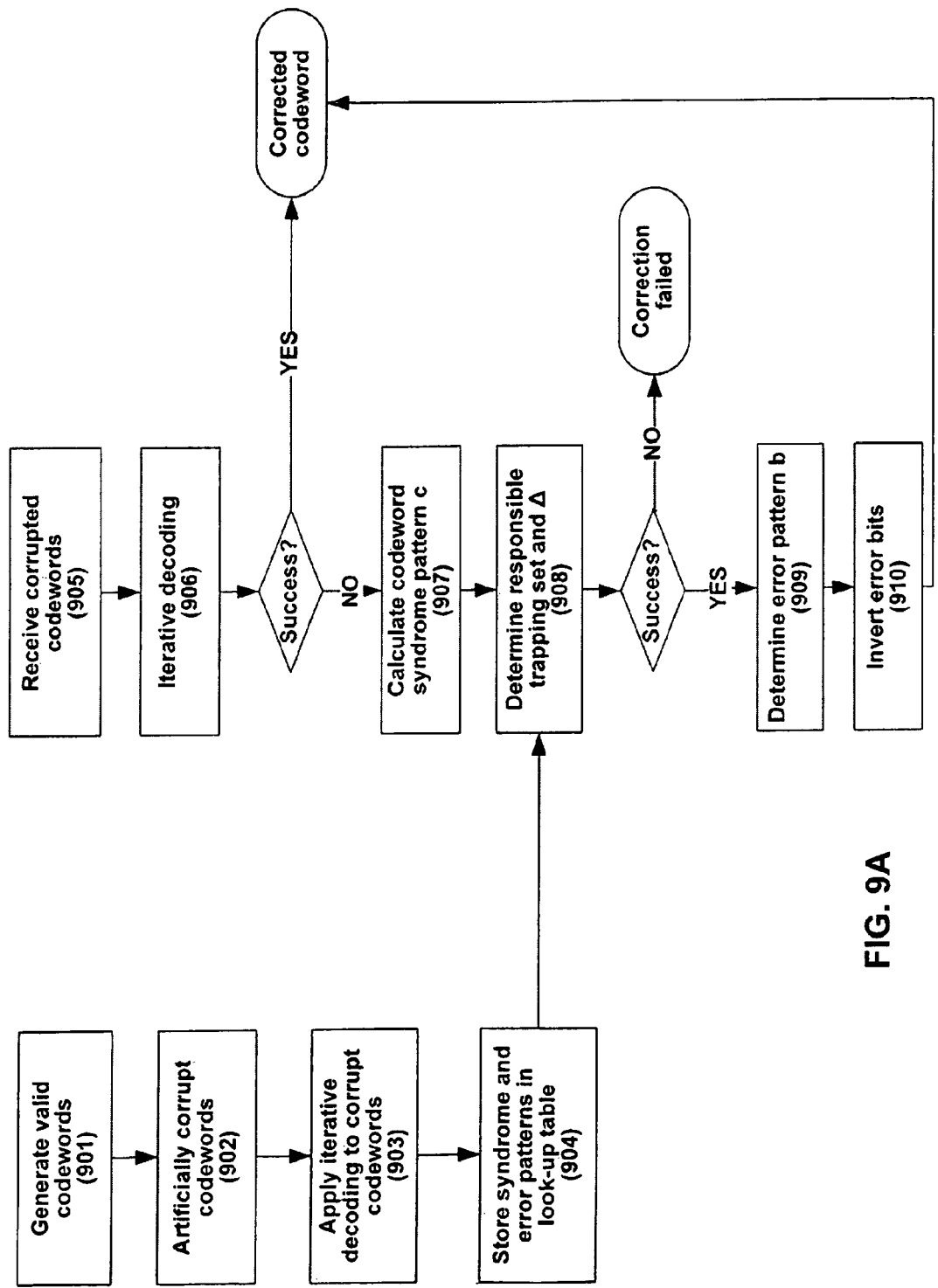
FIG. 9A is a flowchart illustrating the operation of a decoder in accordance with one aspect of the invention.

Referring now to FIG. 9A, there is shown a flowchart 900 detailing a QC-LDPC decoding method in accordance with one embodiment of the present invention. Flowchart 900 shows two series of steps: steps 901-904 and steps 905-910. Steps 901-904 pertain to the development of a trapping set look-up table, such as table 608 of FIG. 6 or table 700 of FIG. 7. This series of steps may be performed offline (i.e., prior to decoder runtime). Steps 905-910, on the other hand, pertain to the actual decoding process, and may be performed during the runtime of the decoder.

At step 901 of the offline segment of flowchart 900, a large number of valid codewords of the employed QC-LDPC code is produced. The codewords can be produced randomly using a random number generator, or they can be produced systematically to cover the spectrum of possible codewords. At step 902, the valid codewords are artificially corrupted to simulate transmission through a corruptive channel. For example, white Gaussian noise may be added to the valid codewords to simulate noise. At step 903, a standard iterative QC-LDPC decoding algorithm is applied to the corrupted codewords. For example, step 903 may be performed by iterative decoder 602 of FIG. 6. At step 904, the syndrome and error patterns of the codewords that were unsuccessfully decoded in step 903 due to trapping sets are calculated and stored, thereby creating a trapping set look-up table. The error patterns are determined by comparing the corrupted codewords with the original codewords produced at step 901. A graph-based search algorithm and/or importance sampling method may also be used at step 904 to identify the trapping sets. If a large enough sample of codewords is generated at step 901, the relative dominance of the trapping sets can be statistically determined, in terms of absolute number of failures or percentage of failure. Thus, if there exists a memory constraint for the look-up table at step 904, the syndrome and error patterns of the most dominant trapping sets may be preferentially stored over less dominant trapping sets. In addition, as discussed above, one may store one syndrome and error pattern pair in connection with each trapping set class because the syndrome and error patterns of the other class members can be constructed using Equations 1-4.

Referring now to runtime steps 905-910, corrupted codewords are received for decoding at step 905. At step 906, a standard iterative decoding algorithm is applied to the received codewords. For example, step 906 may be performed by iterative decoder 602 of FIG. 6. If the iterative decoding process at step 906 converges to a valid codeword, the decoding process is concluded and the corrected codeword is outputted. However, if the iterative decoding at step 906 does not converge to a valid codeword after a decoder-imposed maximum number of iterations is performed, then the decoding process proceeds to step 907, where the syndrome pattern c of the received codeword is calculated. The syndrome pattern may be calculated in node index notation, like syndrome pattern c in FIG. 6. If a binary vector syndrome is calculated instead, like syndrome 206 in FIG. 2A, the binary vector syndrome may be converted into syndrome pattern notation before proceeding with steps 908-910.

Figure 9B:
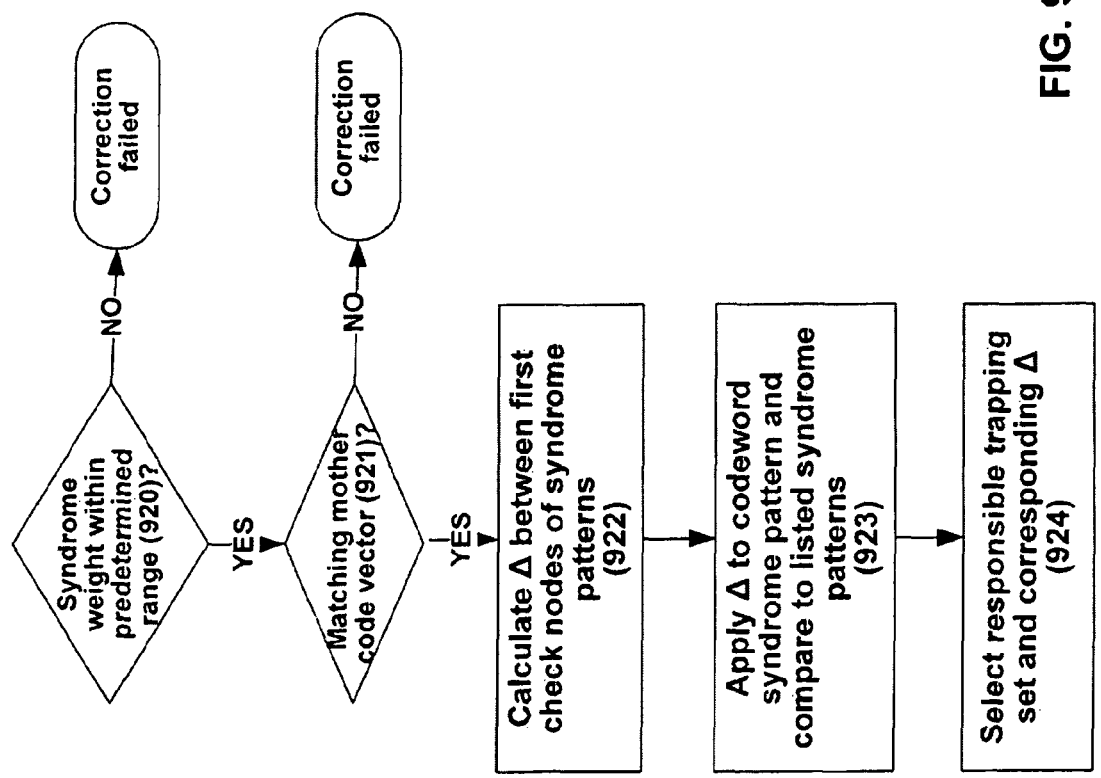
FIG. 9B is a more detailed flowchart illustrating trapping set selection in accordance with one aspect of the invention.

At step 908, the look-up table created at step 904 may be used to determine the trapping set and trapping set class that is responsible for the failure at step 906. A more detailed flowchart illustrating trapping set selection 908 in an exemplary embodiment of the invention is shown in FIG. 9B. Referring to FIG. 9B, at step 920, the decoder may check the syndrome weight of the received codeword to determine whether the weight is within a predetermined range. This predetermined range may correspond to the range of syndrome weights that have entries in the look-up table. Since the look-up table is typically produced offline, as shown in steps 901-904 of FIG. 9A, the predetermined range used at step 920 may be hard-wired or hard-coded into the decoder. In other embodiments, the decoder may execute step 920 by comparing the syndrome weight of the received codeword to the syndrome weights listed in the look-up table. If the codeword syndrome weight is not within the predetermined range or not found in the look-up table, then the responsible trapping set might not be stored in the look-up table and the decoder may abort and move on to the next received codeword.

On the other hand, if the codeword syndrome weight is found in the look-up table, then the decoder may determine at step 921 if any trapping sets listed in the look-up table have the same mother code vector $y_m$ as that of syndrome pattern c. If at least one matching mother code vector is found in the look-up table, the decoder may proceed to step 922. At step 922, the decoder may calculate the quasi-cyclic shift difference $\Delta$ between the first check node of syndrome pattern c and the first check node of each trapping set listed in the look-up table whose row mother code vector is equal to $y_m$. At step 923, the decoder may apply quasi-cyclic shifts of magnitude $\Delta$ to each trapping set listed in the look-up table for which a shift difference $\Delta$ was calculated at step 922. The decoder may then compare the resulting shifted syndrome patterns to syndrome pattern c. If a shifted syndrome pattern is found to equal c, the shifted syndrome pattern may belong to the responsible trapping set, and the corresponding trapping set listed in the look-up table may be a member of the responsible trapping set class. At step 924, the most likely responsible trapping set is selected and the magnitude $\Delta$ of the shift used to generate it is saved.

In some scenarios, multiple trapping sets may have shifted syndrome patterns equal to c. In these scenarios, the decoder may use a metric to choose one trapping set over the others as the most likely responsible trapping set. For example, the decoder may sum the magnitudes of the error bit LLRs for each trapping set and chose the trapping set with the smallest sum as the most likely responsible trapping set. The decoder may also compare the LLR magnitude of each bit in the trapping sets to a fixed threshold and chose the trapping set with the greatest number of bits with LLRs lower than the threshold. Other metrics may also be used to chose between trapping sets with identical syndrome patterns.

Referring back to FIG. 9A, if the decoder succeeds in selecting a responsible trapping set and saving its corresponding shift magnitude $\Delta$ at step 908, the decoder may retrieve from the look-up table the error pattern stored in connection with the responsible trapping set class. The decoder may then apply a quasi-cyclic shift of magnitude $\Delta$ to retrieved error pattern to produce the error pattern b of the responsible trapping set (step 909). Error pattern b lists the locations of the erroneous bits in the received codeword. At step 910, the decoder inverts the erroneous bits identified by error pattern b, thereby producing the corrected codeword.

It should be understood that the flowchart of FIG. 9 is merely illustrative. Any of the steps in these processes may be omitted, modified, combined, and/or rearranged, and any additional steps may be performed, without departing from the scope of the invention.

Referring now to FIGS. 10-16, various exemplary implementations of the present invention are shown.

Figure 10:
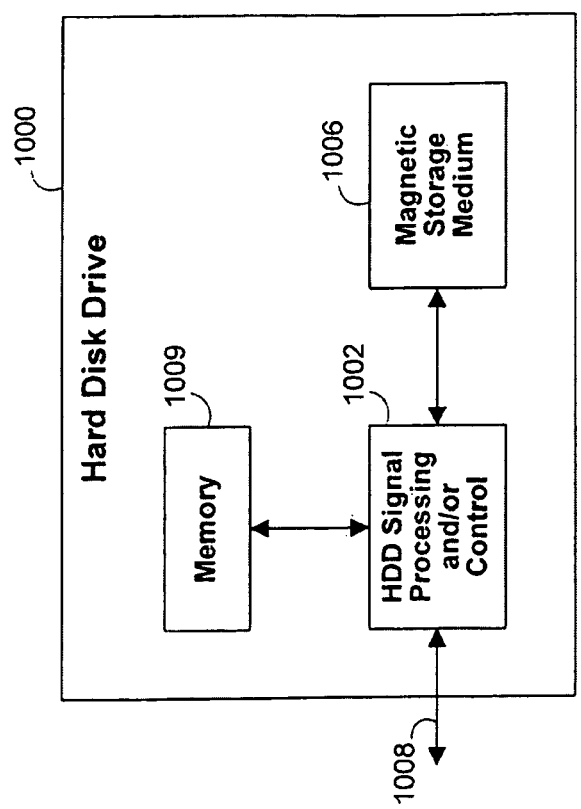
FIG. 10 is a block diagram of an exemplary hard disk drive that can employ the disclosed technology.

Referring now to FIG. 10, the present invention can be implemented in a hard disk drive 1000. The present invention may implement either or both signal processing and/or control circuits, which are generally identified in FIG. 10 at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), nonvolatile memory such as flash memory, read only memory (ROM) and/or other suitable electronic data storage.

Figure 11:
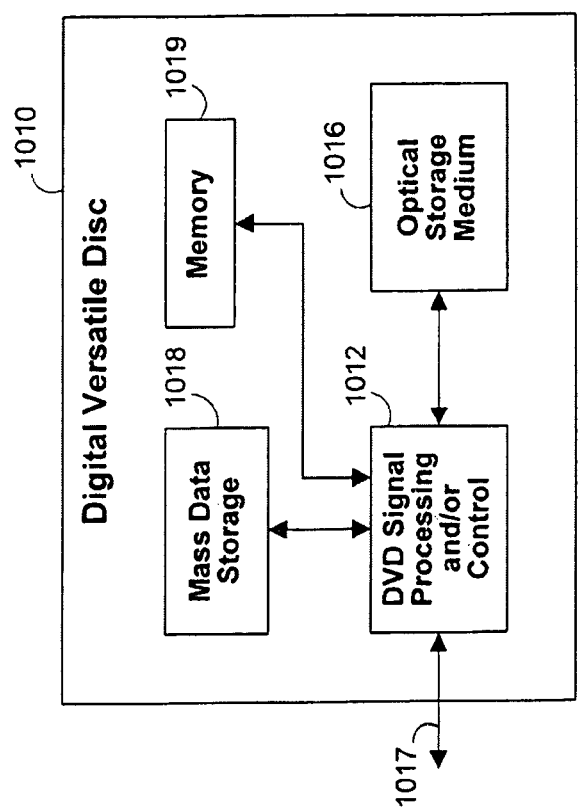
FIG. 11 is a block diagram of an exemplary digital versatile disc that can employ the disclosed technology.

Referring now to FIG. 11, the present invention can be implemented in a digital versatile disc (DVD) drive 1010. The present invention may implement either or both signal processing and/or control circuits, which are generally identified in FIG. 11 at 1012, and/or mass data storage 1018 of the DVD drive 1010. The signal processing and/or control circuit 1012 and/or other circuits (not shown) in the DVD drive 1010 may process data, perform coding and/or encryption, perform calculations, and/or format data that is read from and/or data written to an optical storage medium 1016. In some implementations, the signal processing and/or control circuit 1012 and/or other circuits (not shown) in the DVD drive 1010 can also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD drive 1010 may communicate with mass data storage 1018 that stores data in a nonvolatile manner. The mass data storage 1018 may include a hard disk drive (HDD). The HDD may have the configuration shown in FIG. 10. The HDD may be a mini HDD that includes one or more platters having a diameter that is smaller than approximately 1.8". The DVD drive 1010 may be connected to memory 1019 such as RAM, ROM, nonvolatile memory such as flash memory and/or other suitable electronic data storage.

Figure 12:
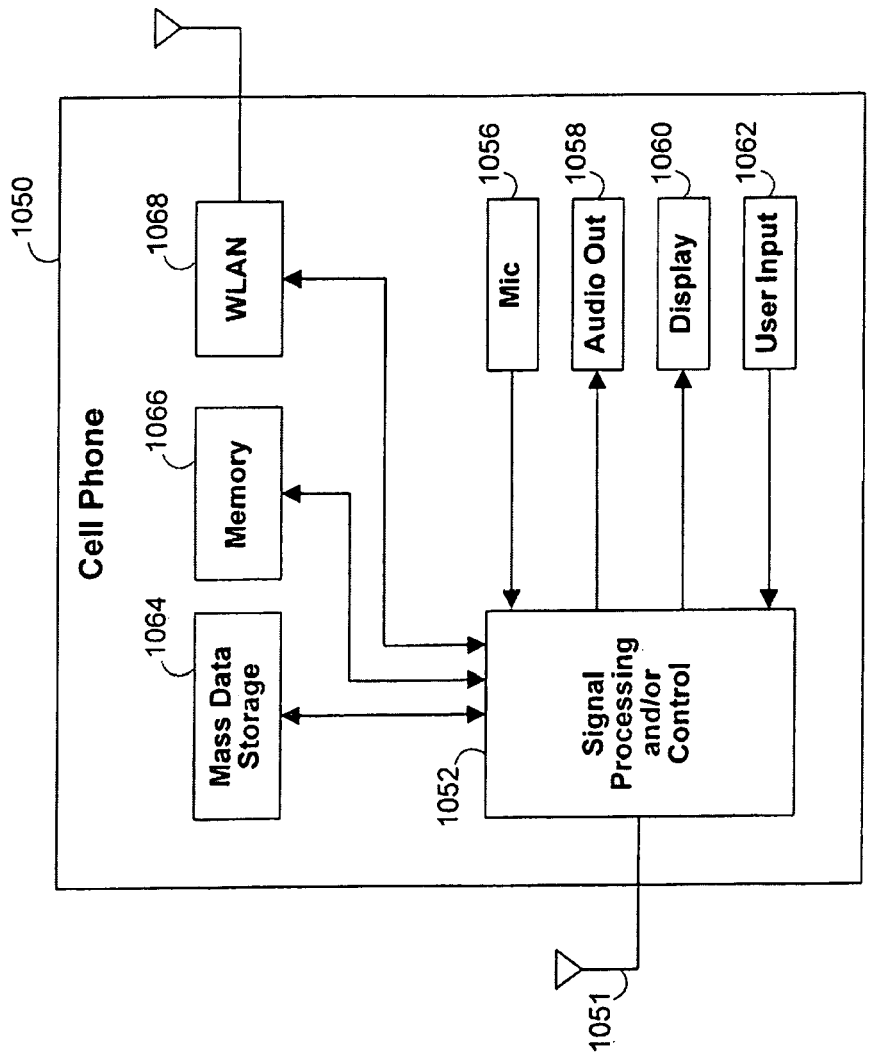
FIG. 12 is a block diagram of an exemplary cell phone that can employ the disclosed technology.

Referring now to FIG. 12, the present invention can be implemented in a cellular phone 1050 that may include a cellular antenna 1051. The present invention may implement either or both signal processing and/or control circuits, which are generally identified in FIG. 12 at 1052, a WLAN interface 1068 and/or mass data storage 1064 of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 10 and/or at least one DVD may have the configuration shown in FIG. 11. The HDD may be a mini HDD that includes one or more platters having a diameter that is smaller than approximately 1.8". The cellular phone 1050 may be connected to memory 1066 such as RAM, ROM, nonvolatile memory such as flash memory and/or other suitable electronic data storage. The cellular phone 1050 also may support connections with a WLAN via a WLAN network interface 1068.

Figure 13:
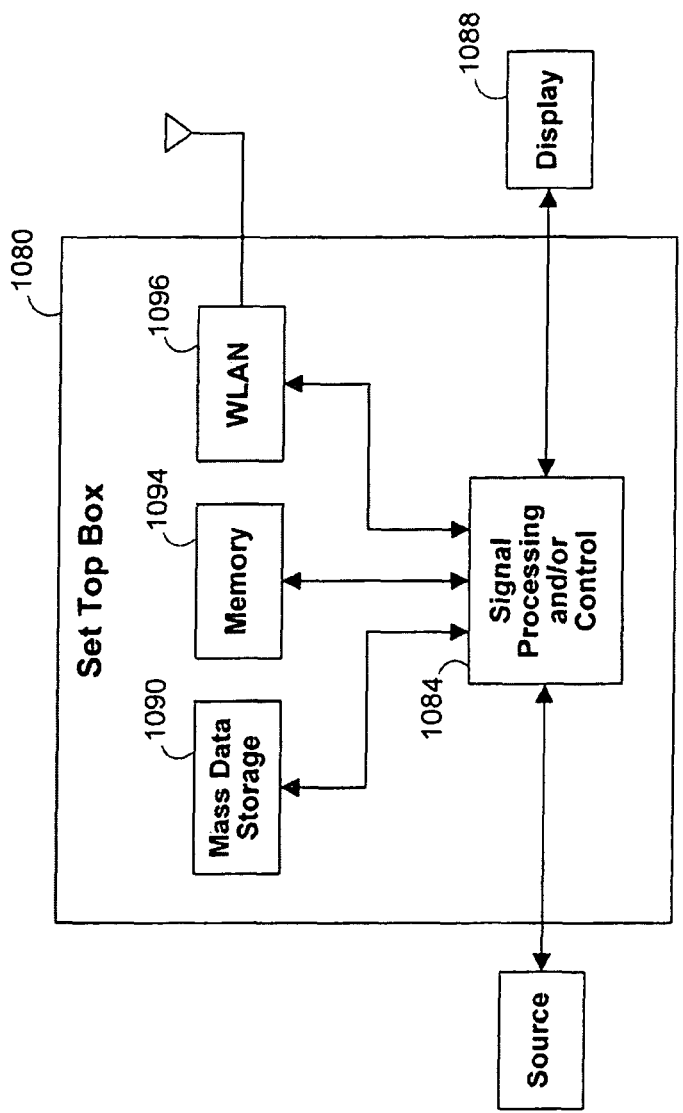
FIG. 13 is a block diagram of an exemplary set top box that can employ the disclosed technology.

Referring now to FIG. 13, the present invention can be implemented in a set top box 1080. The present invention may implement either or both signal processing and/or control circuits, which are generally identified in FIG. 13 at 1084, a WLAN interface 1096 and/or mass data storage 1090 of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives HDD and/or DVDs. At least one HDD may have the configuration shown in FIG. 10 and/or at least one DVD may have the configuration shown in FIG. 11. The HDD may be a mini HDD that includes one or more platters having a diameter that is smaller than approximately 1.8". The set top box 1080 may be connected to memory 1094 such as RAM, ROM, nonvolatile memory such as flash memory and/or other suitable electronic data storage. The set top box 1080 also may support connections with a WLAN via a WLAN network interface 1096.

Figure 14:
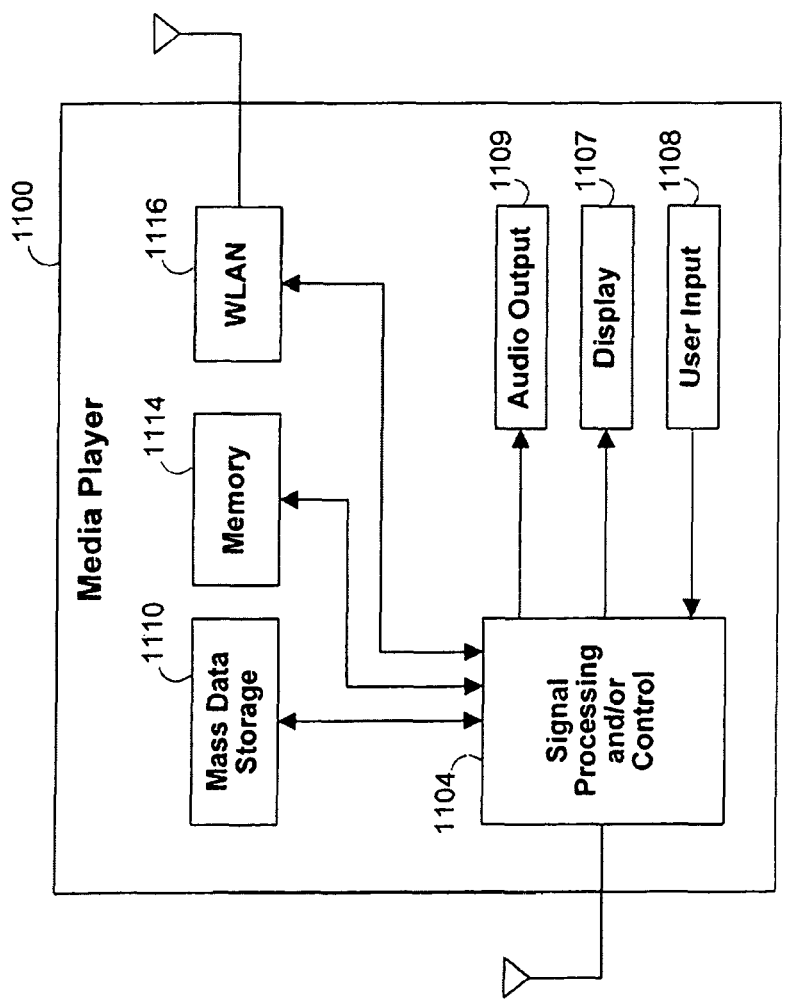
FIG. 14 is a block diagram of an exemplary media player that can employ the disclosed technology.

Referring now to FIG. 14, the present invention can be implemented in a media player 1100. The present invention may implement either or both signal processing and/or control circuits, which are generally identified in FIG. 14 at 1104, a WLAN interface 1116 and/or mass data storage 1110 of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 10 and/or at least one DVD may have the configuration shown in FIG. 11. The HDD may be a mini HDD that includes one or more platters having a diameter that is smaller than approximately 1.8". The media player 1100 may be connected to memory 1114 such as RAM, ROM, nonvolatile memory such as flash memory and/or other suitable electronic data storage. The media player 1100 also may support connections with a WLAN via a WLAN network interface 1116. Still other implementations in addition to those described above are contemplated.

The foregoing describes systems and methods for QC-LDPC decoding. Those skilled in the art will appreciate that the invention can be practiced by other than the described embodiments, which are presented for the purpose of illustration rather than of limitation.

What is claimed is:

1. A method for decoding a received codeword, the method comprising:
   decoding the received codeword using an iterative decoding algorithm;
   determining a syndrome pattern c of the received codeword when the iterative decoding algorithm fails to decode the received codeword;
   determining, based on the determined syndrome pattern c, a responsible trapping set class;
   determining, based on the determined syndrome pattern c and the responsible trapping set class, an error pattern b corresponding to the received codeword; and
   correcting erroneous bits of the received codeword based on the determined error pattern b.

2. The method of claim 1, further comprising searching a trapping set look-up table for the responsible trapping class, wherein the trapping set look-up table stores, for each of a plurality of trapping set classes, a syndrome pattern and an error pattern of a member of the trapping set class.

3. The method of claim 2, further comprising:
   retrieving from the trapping set look-up table a syndrome pattern c' and an error pattern b' of a member of the responsible trapping set class; and
   determining the error pattern b corresponding to the received codeword based on the determined syndrome pattern c, the syndrome pattern c', and the error pattern b'.

4. The method of claim 3, wherein calculating the error pattern b comprises calculating a quasi-cyclic shift difference $\Delta$ between c and c', and applying a quasi-cyclic shift of magnitude $\Delta$ to b' to obtain b.

5. The method of claim 4, wherein an employed QC-LDPC code is characterized by a parity check matrix described by column mother code vector $x_m$, row mother code vector $y_m$, column circulant vector $x_c$, row circulant vector $y_c$, and Z×Z circulant sub-matrices, and wherein calculating the quasi-cyclic shift difference $\Delta$ between c and c' comprises finding $\Delta$ that satisfies:

$$c[i]=y_m[i]*Z+y_c[i], \text{ and}$$

$$c[i]'=y_m[i]*Z+\mathrm{mod}(y_c[i]\Delta,Z);$$

where c[i] is an element of c, c[i]' is an element of c', $y_m[i]$ is an element of $y_m$, and $y_c[i]$ is an element of $y_c$.

6. The method of claim 5, wherein calculating the error pattern b of the received codeword based on the syndrome pattern c, the retrieved syndrome pattern c', and the retrieved error pattern b' comprises calculating b that satisfies:

$$b[j]'=x_m[j]*Z+\mathrm{mod}(x_c[j]+\Delta,Z), \text{ and}$$

$$b[j]=x_m[j]*Z+x_c[j];$$

where b[j]' is an element of b', b[i] is an element of b, $x_m[j]$ is an element of $x_m$, and $x_c[j]$ is an element of $x_c$.

7. The method of claim 2, wherein the trapping set class responsible for the iterative decoder's failure contains a member having syndrome pattern equal to syndrome pattern c.

8. The method of claim 2, further comprising:
   indexing the look-up table by a syndrome weight; and
   determining if a respective syndrome weight of syndrome pattern c is listed in the look-up table.

9. The method of claim 2, wherein the error pattern b comprises locations of erroneous bits in the received codeword.

10. A decoder comprising:
    an iterative decoder operable to decode a received codeword; and
    decoder circuitry configured to:
    determine a syndrome pattern c of the received codeword when the iterative decoder fails to decode the received codeword;

determine, based on the determined syndrome pattern c, a responsible trapping set class;

determine, based on the determined syndrome pattern c and the responsible trapping set class, an error pattern b corresponding to the received codeword; and correct erroneous bits of the received codeword based on the determined error pattern b.

11. The decoder of claim 10, wherein the decoder further comprises a trapping set look-up table storing, for each of a plurality of trapping set classes, a syndrome pattern and an error pattern of a member of the trapping set class, and wherein the decoder circuitry is further configured to search the look-up table for the responsible trapping class.

12. The decoder of claim 11, wherein the decoder circuitry is further configured to:

retrieve from the look-up table a syndrome pattern c' and an error pattern b' of a member of the responsible trapping set class; and determine the error pattern b corresponding to the received codeword based on the determined syndrome pattern c, the syndrome pattern c', and the error pattern b'.

13. The decoder of claim 12, wherein the decoding circuitry is further configured to:

calculate a quasi-cyclic shift difference $\Delta$ between c and c'; and apply a quasi-cyclic shift of magnitude $\Delta$ to b' to obtain b.

14. The decoder of claim 13, wherein an employed QC-LDPC code is characterized by a parity check matrix described by column mother code vector $x_m$, row mother code vector $y_m$, column circulant vector $x_c$, row circulant vector $y_c$, and Z×Z circulant sub-matrices, and wherein the decoding circuitry is further configured to:

calculate the quasi-cyclic shift difference $\Delta$ between c and c' by finding $\Delta$ that satisfies:

$c[i]=y_m[i]*Z+y_c[i]$, and $c[i]'=y_m[i]*Z+\mathrm{mod}(y_c[i]+\Delta,Z);$ where c[i] is an element of c, c[i]' is an element of c', $y_m[i]$ is an element of $y_m$, and $y_c[i]$ is an element of $y_c$.

15. The decoder of claim 14, wherein the decoding circuitry is further configured to:

calculate the error pattern b of the received codeword based on the received codeword's syndrome pattern c, the retrieved syndrome pattern c', and the retrieved error pattern b' by finding b that satisfies:

$b[j]'=x_m[j]*Z+\mathrm{mod}(x_c[j]+\Delta,Z)$, and $b[j]=x_m[j]*Z+x_c[j];$ where b[j]' is an element of b', b[i] is an element of b, $x_m[j]$ is an element of $x_m$, and $x_c[j]$ is an element of $x_c$.

16. The decoder of claim 11, wherein the trapping set class responsible for the iterative decoder's failure contains a member having syndrome pattern equal to syndrome pattern c.

17. The decoder of claim 11, wherein the look-up table is further indexed by a syndrome weight, and wherein the decoding circuitry is further configured to determine if a respective syndrome weight of syndrome pattern c is listed in the look-up table.

18. The decoder of claim 11, wherein the error pattern b comprises locations of erroneous bits in the received codeword.

19. The decoder of claim 11, wherein the look-up table preferentially stores syndromes and error patterns of dominant trapping sets.

20. A decoder comprising decoder circuitry configured to:

determine a syndrome pattern c of a received codeword when an iterative decoder fails to decode the received codeword;

determine, based on the determined syndrome pattern c, a responsible trapping set class; and correct erroneous bits of the received codeword based on the determined responsible trapping set class.

* * * * *